United States Patent [19]

Yamazaki

[11] Patent Number: 5,607,869
[45] Date of Patent: Mar. 4, 1997

[54] METHOD FOR MANUFACTURING ASYMMETRICAL LDD TYPE MIS DEVICE

[75] Inventor: Yasushi Yamazaki, Tokyo, Japan

[73] Assignee: NEC Corporation, Tokyo, Japan

[21] Appl. No.: 595,369

[22] Filed: Feb. 1, 1996

Related U.S. Application Data

[62] Division of Ser. No. 362,011, Dec. 22, 1994, Pat. No. 5,547,888.

[30] Foreign Application Priority Data

Dec. 30, 1993 [JP] Japan ................................ 5-352441

[51] Int. Cl.⁶ .................................................. H01L 21/265
[52] U.S. Cl. .................................. 437/40; 437/41; 437/44
[58] Field of Search ............................. 437/45, 40 AS, 437/41 AS, 52, 48, 44

[56] References Cited

U.S. PATENT DOCUMENTS 4,997,779  3/1991  Kohno ............................. 437/41
5,286,664  2/1994  Horiuchi .......................... 437/44
5,330,925  7/1994  Lee et al. ......................... 437/44

FOREIGN PATENT DOCUMENTS 62-58682  3/1987  Japan.
2-158143  6/1990  Japan.

Primary Examiner—Jey Tsai
Attorney, Agent, or Firm—Popham Haik Schnobrich & Kaufman, Ltd.

[57] ABSTRACT

In a method for manufacturing an asymmetrical LDD type MOS transistor, low concentration impurity diffusion regions are formed within a semiconductor substrate on both sides of a gate electrode. Then, sidewall insulating layers are formed on both sides of the gate electrode, and, after that, high concentration impurity diffusion regions are formed within the semiconductor substrate on both sides of the sidewall insulating layers. Then, one of the sidewall insulating layers is removed simulataneously with formation of contact holes in an interlayer formed on on the entire surface. Finally, impurities are implanted with a mask of the interlayer, to enlarge one of the high concentration impurity diffusion regions.

9 Claims, 20 Drawing Sheets

METHOD FOR MANUFACTURING ASYMMETRICAL LDD TYPE MIS DEVICE

This is a divisional of U.S. patent application Ser. No. 08/362,011, filed Dec. 22, 1994, U.S. Pat. No. 5,547,888.

BACKGROUND OF THE INVENTION

1. Field of the Invention

The present invention relates to a method for manufacturing an asymmetrical lightly-doped drain (LDD) type metal oxide semiconductor (MOS, broadly, MIS) device.

2. Description of the Related Art

In a fine-structured MOS device, in order to avoid deterioration of characteristics due to hot carriers, an LDD structure bas been broadly used.

A prior art LDD type MOS device is constructed by a gate electrode via a gate silicon oxide layer on a P-type monocrystalline silicon substrate, sidewall silicon oxide layers on both sides of the gate electrode, $N^-$-type impurity diffusion regions within the substrate beneath the sidewall silicon oxide layers, and $N^+$-type impurity diffusion regions within the substrate outside of the $N^-$-type impurity diffusion regions. In this case, one of the $N^-$-type impurity diffusion regions and one of the $N^+$-type diffusion regions adjacent to each other serve as a drain, and the other of the $N^-$-type impurity diffusion regions and the other of the $N^+$-type impurity diffusion regions adjacent to each other serve as a source. Since the drain and source are symmetrical, this device is called a symmetrical LDD-type MOS device. This will be explained later in detal.

In the above-mentioned prior art symmetrical LDD type MOS device (transistor), however, since the $N^-$-type impurity diffusion region is present on the source region, even when the MOS transistor is turned ON, the amount of carriers, i.e., electrons injected into a channel region is small, so that the ON current becomes small. Also, when this symmetrical LDD type MOS transistor is applied to one static random access memory (SRAM) cell, the presence of two $N^-$-type impurity diffusion regions between two gates of driving transistors increases the distance therebetween, to reduce the integration.

On the other hand, generally, the reliability of a MOS transistor, i.e., the reduction of an ON current by hot carriers is dependent upon a drain structure, and therefore, the $N^-$-type impurity diffusion region within the source region does not contribute to the enhancement of the reliability. In other words, it is preferable that the $N^-$-type impurity diffusion region is absent from the source region. Therefore, in order to improve the symmetrical LDD type MOS transistor, an asymmetrical LDD type MOS transistor has been known (see JP-A-HEI2-158143).

In a prior art method for manufacturing an asymmetrical LDD type MOS transistor, $N^-$-type impurity diffusion regions are formed within a semiconductor substrate on both sides of a gate electrode. Then, a photoresist pattern layer is formed to cover one of the $N^-$-type impurity regions on the drain region, and thereafter, impurities such as arsenic are further implanted into the $N^-$-type impurity diffusion region on the source region side. As a result, the $N^-$-type impurity diffusion region on the source region side is converted into an $N^+$-type impurity diffusion region. Then, sidewall silicon oxide layers are formed on both sides of the gate electrode, and after that, impurities such as arsenic are implanted. As a result, an $N^+$-type impurity diffusion region is formed adjacent to the $N^-$-type impurity diffusion region on the drain region side. This will be explained later in detail.

In the above-mentioned prior art method for manufacturing an asymmetrical LDD type MOS transistor, however, an additional photolithography process for forming the $N^+$-type impurity diffusion region on the source region side is required which increases the manufacturing cost. Also, high concentration ion implantation processes are increased to invite charging-up of charges (electrons) within the substrate and destruction of the gate silicon oxide layer.

SUMMARY OF THE INVENTION

It is an object of the present invention to provide a method for manufacturing an asymmetrical LDD type MOS device which can exhibit an excellent performance without increasing the manufacturing steps.

Another object is to provide a method for manufacturing an SRAM cell which can exhibit a high performance and a high integration.

According to the present invention, in a method for manufacturing an asymmetrical LDD type MOS transistor, low concentration impurity diffusion regions are formed within a semiconductor substrate on both sides of a gate electrode. Then, sidewall insulating layers are formed on both sides of the gate electrode, and, after that, high concentration impurity diffusion regions are formed within the semiconductor substrate on both sides of the sidewall insulating layers. Then, one of the sidewall insulating layers is removed simultaneously with formation of contact holes in an interlayer formed on on the entire surface. Finally, impurities are implanted with a mask of the interlayer, to enlarge one of the high concentration impurity diffusion regions.

This manufacturing method is applied to driving transistors of an SRAM cell having a common source.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, a prior art method for manufacturing an LDD type MOS transistor will be explained with reference to FIGS. 1A through 1F, 2, 3, 4, 5A through 5G, 6 and 7A and 7B.

FIGS. 1A through 1D are cross-sectional views for explaining a prior art method for manufacturing a symmetrical LDD type MOS transistor.

Figure 1A:
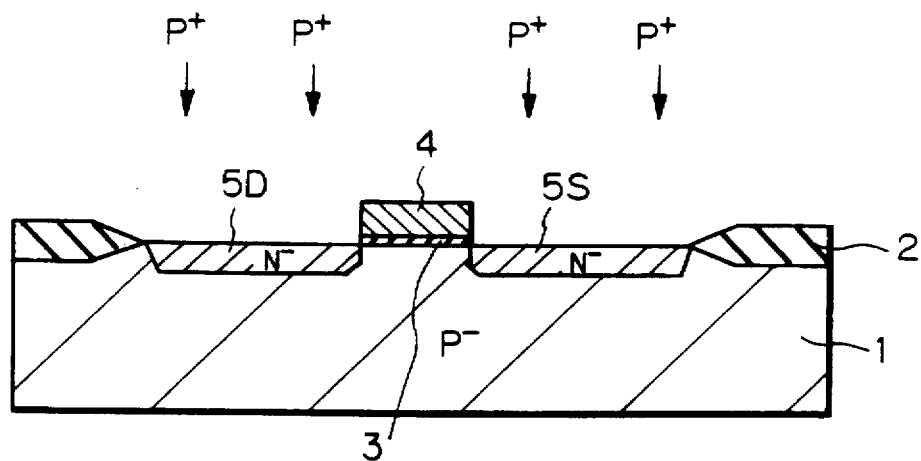
FIGS. 1A through 1F are cross-sectional views illustrating a prior art method for manufacturing a symmetrical LDD type MOS device.

First, referring to FIG. 1A, an about 5000 Å thick field silicon oxide layer 2 is grown on a P$^-$-type monocrystalline silicon substrate 1 by using a local oxidation of silicon (LOCOS) process. Then, an about 150 Å thick gate silicon oxide layer 3 is grown by thermally oxidizing the substrate 1. Then, an about 2000 Å thick polycrystalline silicon layer is deposited on the entire surface by using a low pressure chemical vapor deposition (LPCVD) process, and about $5 \times 10^5$ N-type impurity ions such as phosphorous ions/cm$^2$ are implanted into the polycrystalline silicon layer. After that, the polycrystalline silicon layer is patterned by using a photolithography process and a reactive ion etching (RIE) process 4. Then, about $1 \times 10^{13}$ phosphorous ions/cm$^2$ are implanted into the substrate 1, and the device is annealled in a nitrogen atmosphere at a temperature of about 900° C. Thus, N$^-$-type impurity diffusion regions 5D and 5S are formed within the substrate 1 in self-alignment with the gate electrode 4.

Figure 1B:
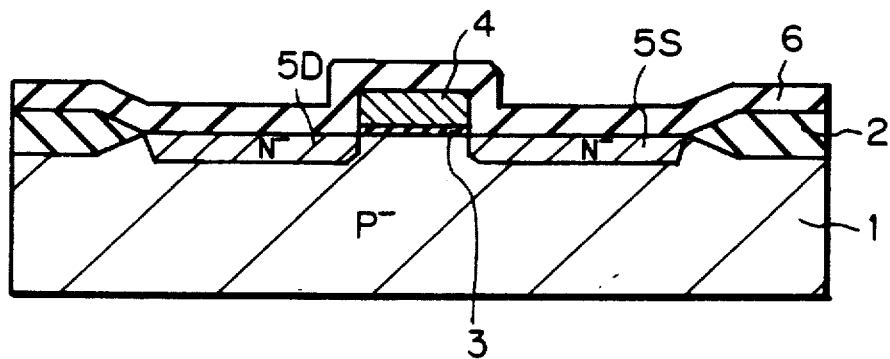

Next, referring to FIG. 1B, an about 2000 Å thick silicon oxide layer 6 is deposited on the entire surface by using a high temperature LPCVD.

Figure 1C:
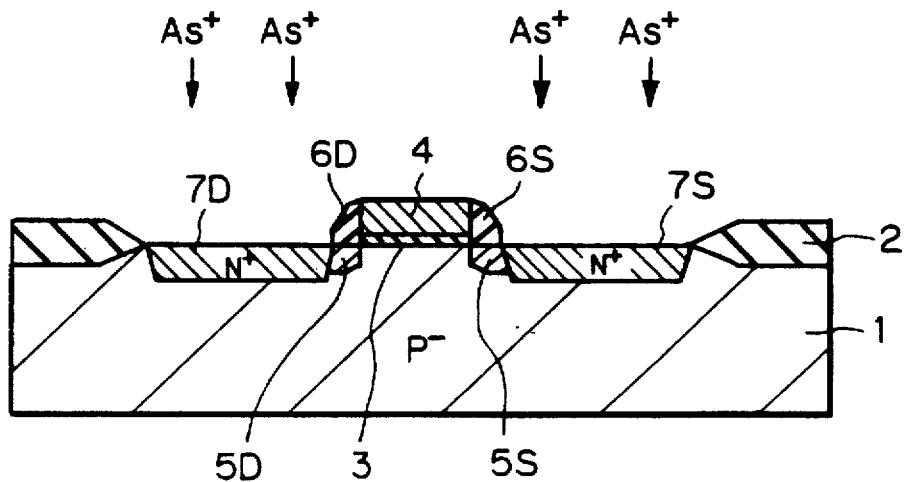

Next, referring to FIG. 1C, the silicon oxide layer 6 is etched back by using an anisotropicalal RIE etching process, so that sidewall silicon oxide layers 6D and 6C are left on the sides of the gate electrode 4. Then, about $1 \times 10^{15}$ arsenic ions/cm$^2$ are implanted into the substrate 1 with a mask of the gate electrode 4 and the sidewall silicon oxide layers 6D and 6S, so that N$^+$-type impurity diffusion regions 7D and 7S are formed within the substrate 1 in self-alignment with the sidewall silicon layers 6D and 6S. In this case, the N$^+$-type impurity diffusion regions 7D and 7S are located outside of the N$^-$-type impurity diffusion regions 5D and 5S, respectively.

Figure 1D:
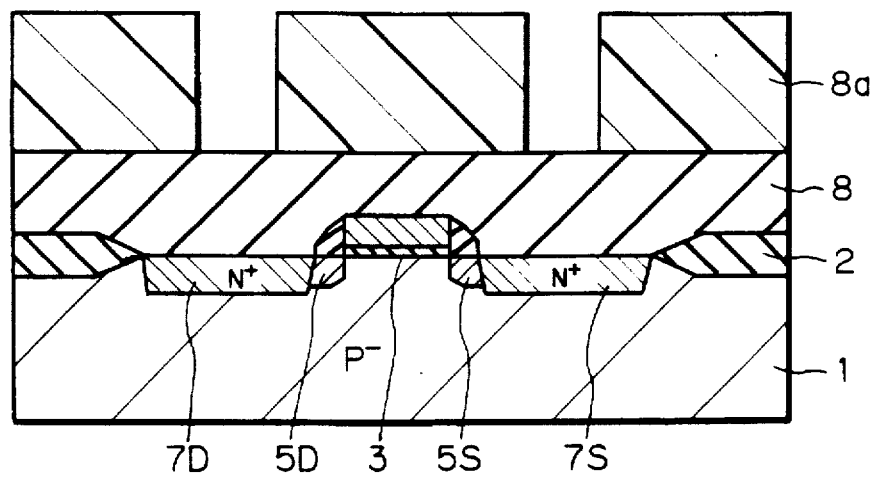

Next, referring to FIG. 1D, an about 5000 Å thick phospho-silicate glass (PSG) layer 8 is deposited on the entire surface by using a CVD process. Then, a photoresist pattern layer 8a is formed by using a photolithography process.

Figure 1E:
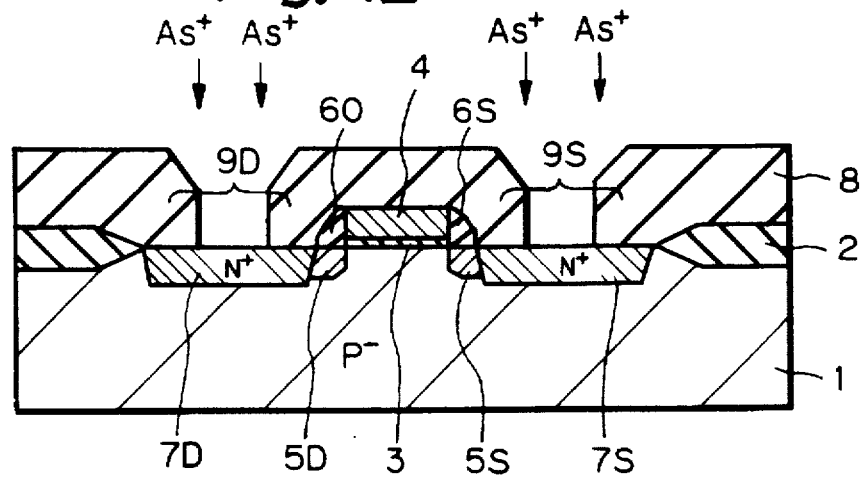

Next, referring to FIG. 1E, the PSG layer 8 is patterned by using an RIE process. As a result, contact holes 9D and 9S for the N$^+$-type impurity regions 7D and 7S, respectively, are perforated within the PSG layer 8, and simultaneously, a contact hole (not shown) is perforated within the PSG layer 8. Also, about $5 \times 10^{15}$ phosphorous ions or arsenic ions/cm$^2$ are implanted into the PSG layer 8 in the periphery of the contact holes, to avoid junction leakage current flowing through contact structures (see aluminium connection layer 10) formed in the contact holes.

Figure 1F:
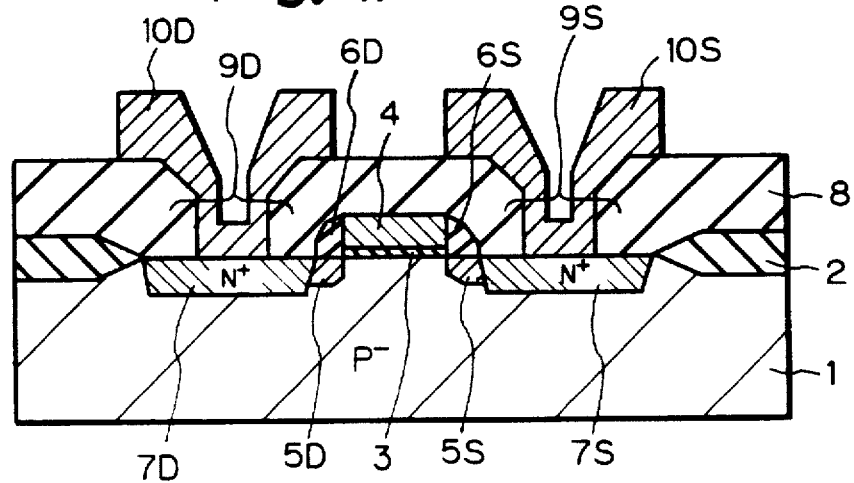

Finally, referring to FIG. 1F, an aluminum layer is deposited on the entire surface, and is patterned by using a photolithography process and an RIE process, to form connection layers 10D and 10S within the contact holes 9D and 9S, respectively, and a connection layer (not shown) connected to the gate electrode 4.

Thus, a symmetrical LDD type MOS transistor is completed.

Figure 2:
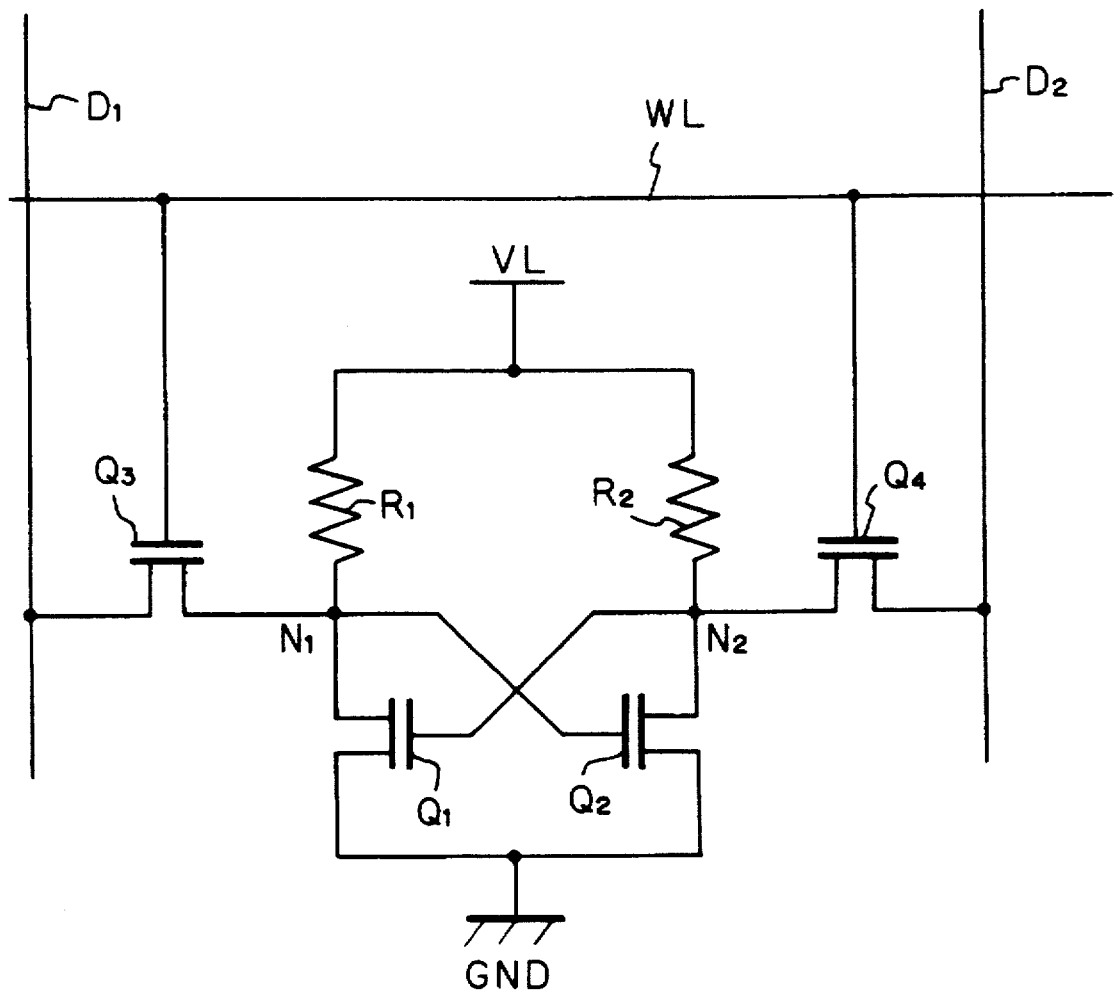
FIG. 2 is a circuit diagram illustrating a conventional SRAM cell.

The above-mentioned LDD type MOS transistor obtained by the manufacturing method as shown in FIGS. 1A through 1D is applied to a static random access memory (SRAM) cell as illustrated in FIG. 2. That is, one SRAM cell is constructed by a flip-flop formed by high resistance loads R$_1$ and R$_2$ and driving transistor Q$_1$ and Q$_2$ between a high voltage line VL and a ground voltage line GND. Also, provided between nodes N$_1$ and N$_2$ and digit lines D$_1$ and D$_2$ are transfer transistors Q$_3$ and Q$_4$ which are controlled by time voltage at a word line WL.

Figure 3:
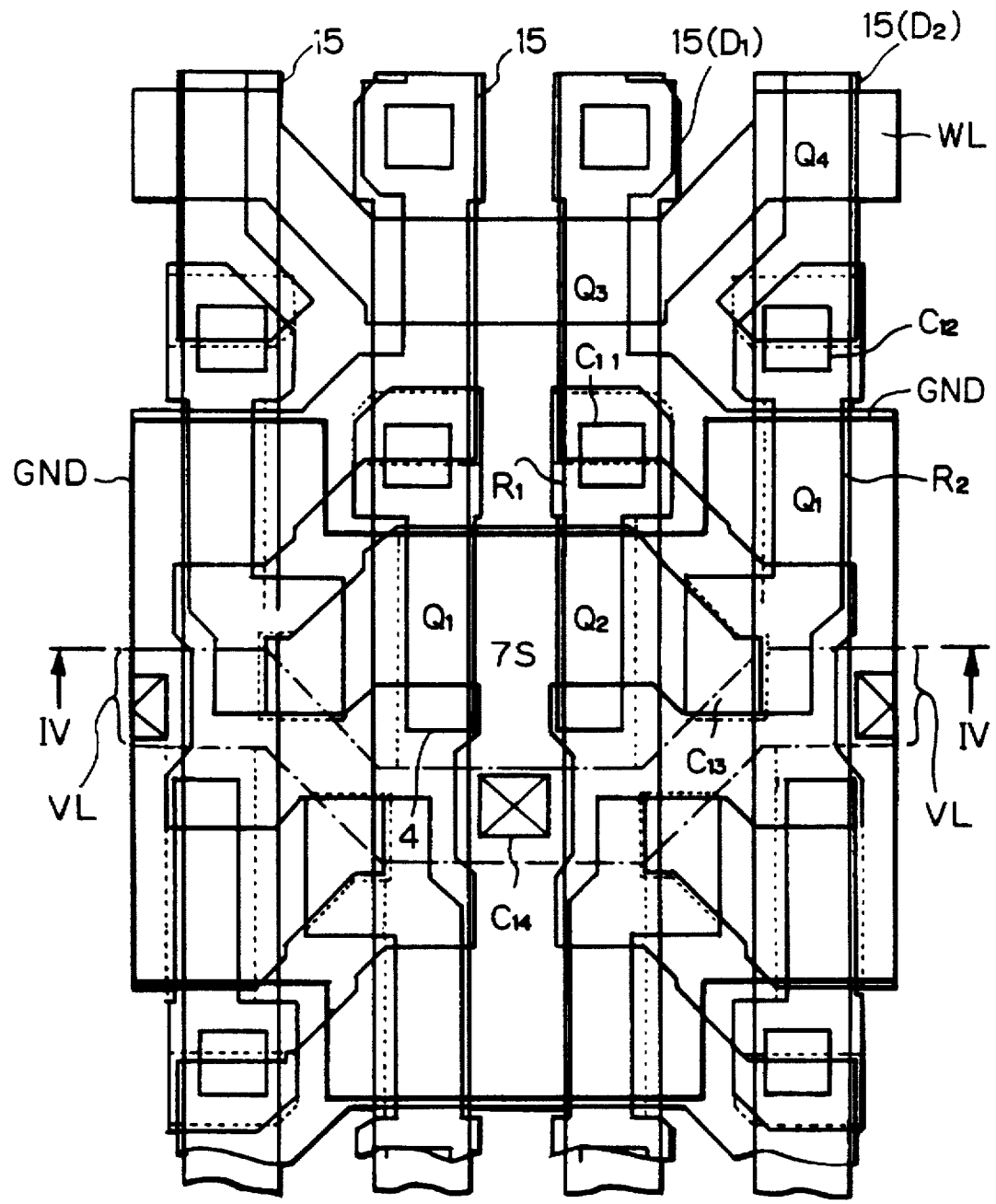
FIG. 3 is a plan view of the SRAM cells of FIG. 2 to which the prior art manufacturing method as shown in FIGS. 1A through 1F is applied.

Referring to FIG. 3, the load R$_1$ is connected between the high voltage line VL and the gate of the driving transistor Q$_2$ via a contact hole C$_{11}$. Similarly, the load R$_2$ is connected between the high voltage line VL and the gate of the driving transistor Q$_2$ via a contact hole C$_{12}$. Also, the gate of the driving transistor Q$_1$ is connected via a direct contact structure to the drain region of the driving transistor Q$_2$. Similarly, the gate of the driving transistor Q$_2$ is connected via a direct contact structure to the drain region of the driving transistor Q$_1$. Further, the drain region of the driving transistor Q$_1$ is connected via the transfer transistor Q$_3$ to the digit line D$_1$. Similarly, the drain region of the driving transistor Q$_2$ is connected via the transfer transistor Q$_4$ to the digit line D$_2$. The gates of the transfer transistor Q$_3$ and Q$_4$ are both connected to the word line WL. Further, the source regions of the driving transistors Q$_1$ and Q$_2$ are both connected to the N$^+$-type impurity region 7S which is further connected via a ground contact hole C$_{14}$ to the ground voltage line GND. Here, the above-described symmetrical LDD type MOS transistor is applied to all of the transistors Q$_1$, Q$_2$, Q$_3$ and Q$_4$ of FIGS. 2 and 3.

Figure 4:
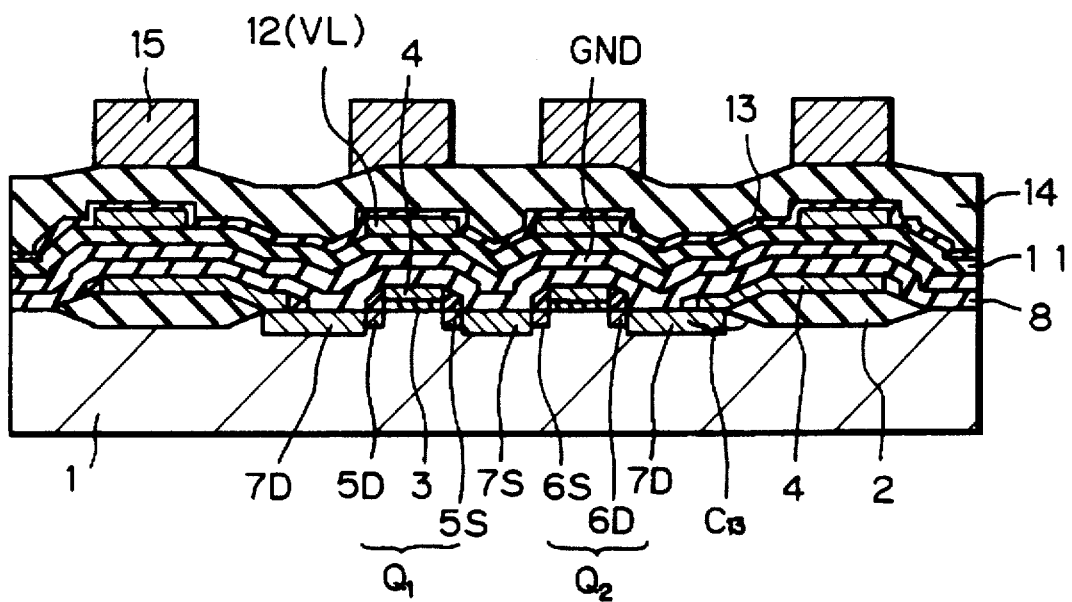
FIG. 4 is a cross-sectional view of the SRAM cells of FIG. 3.

Also, referring to FIG. 4, which is a cross-sectional view taken along the line IV—IV, in the same way as in FIG. 1D, the P$^-$-type monocrystalline silicon substrate 1, the field silicon oxide layer 2, on the substrate 1, the gate silicon oxide layer 3 on the substrate 1, the symmetrical sidewall silicon oxide layers 6D and 6S, the symmetrical N$^-$-type impurity diffusion regions 5D and 5S immediately below the sidewall silicon oxide layers 6D and 6S, the symmetrical N$^+$-type impurity diffusion regions 7D and 7S outside of the N$^-$-type impurity diffusion regions 5D and 5S, the PSG layer 8, and the GND layer 10 are provided. The gate 4 is connected via the direct contact hole C$_{13}$ to the N$^+$-type impurity diffusion regions 7D. Further, an interlayer 11, a high resistance polycrystalline silicon layer 12, a high resistance cover layer 13, an interlayer 14, and an aluminium connection layer 15 are provided. Note that the high resistance polycrystalline silicon layer 12 forms the high resistance loads R$_1$ and R$_2$ of FIGS. 2 and 3, and the aluminum connection layer 15 forms the digit lines D$_1$ and D$_2$ of FIGS. 2 and 3.

In the above-mentioned prior art symmetrical LDD type MOS transistor, however, since the N$^-$-type impurity diffusion region 5S is present in the channel region on the side of the N$^+$-type impurity region 7S, even when the MOS transistor is turned ON, the amount of carriers, i.e., electrons injected into the channel region is small, so that the ON current becomes small. Also, when this symmetrical LDD type MOS transistor is applied to one SRAM cell, the presence of two N⁻-type impurity diffusion regions between two gates of driving transistors increases the distance therebetween, which reduces the integration.

On the other hand, generally, the reliability of a MOS transistor, i.e., the reduction of an ON current by hot carriers is dependent upon a drain structure, and therefore, the N⁻-type impurity diffusion region 5S within the source region does not contribute to the enhancement of the reliability. In other words, it is preferable that the N⁻-type inpurity diffusion region 5S is absent from the source region. Therefore, in order to improve the symmetrical LDD type MOS transistor, an asymmetrical LDD type MOS transistor has been known (see JP-A-HEI2-158143).

A prior art method for manufacturing an asymmetrical LDD type MOS transistor is explained next with reference to FIGS. 5A through 5G.

Figure 5A:
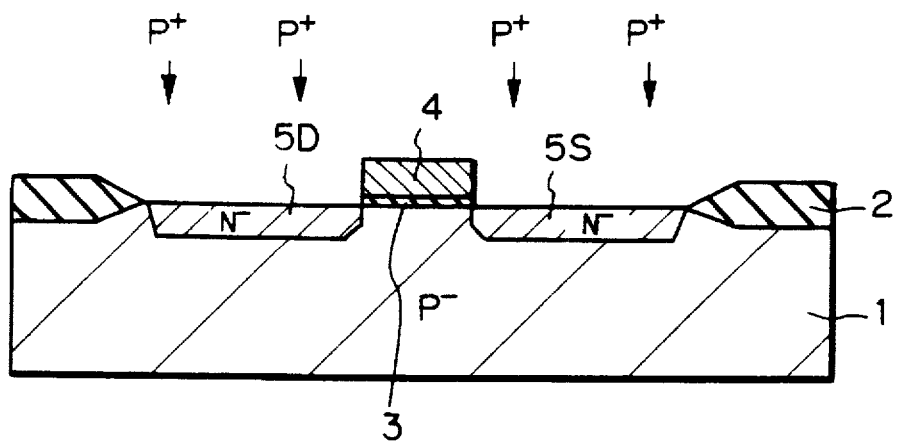
FIGS. 5A through 5G are cross-sectional views illustrating a prior art method for manufacturing an asymmetrical LDD type MOS device.

First, referring to FIG. 5A, in the same way as in FIG. 1A, an about 5000 Å thick field silicon oxide layer 2 is grown on a P⁻-type monocrystalline silicon substrate 1 by using a LOCOS process. Then, an about 150 Å thick gate silicon oxide layer 3 is grown by thermally oxidizing the substrate 1. Then, an about 2000 Å thick polycrystalline silicon layer is deposited on the entire surface by using an LPCVD process, and about 5×10⁵ N-type impurity ions such as phosphorous ions/cm² are implanted into the polycrystalline silicon layer. After that, the polycrystalline silicon layer is patterned by using a photolithography process and an RIE process 4. Then, about 1×10¹³ phosphorous ions/cm² are implanted into the substrate 1, and the device is annealed in a nitrogen atmosphere at a temprature of about 900° C. Thus, N⁻-type impurity diffusion regions 5D and 5S are formed within the substrate 1 in self-alignment with the gate electrode 4.

Figure 5B:
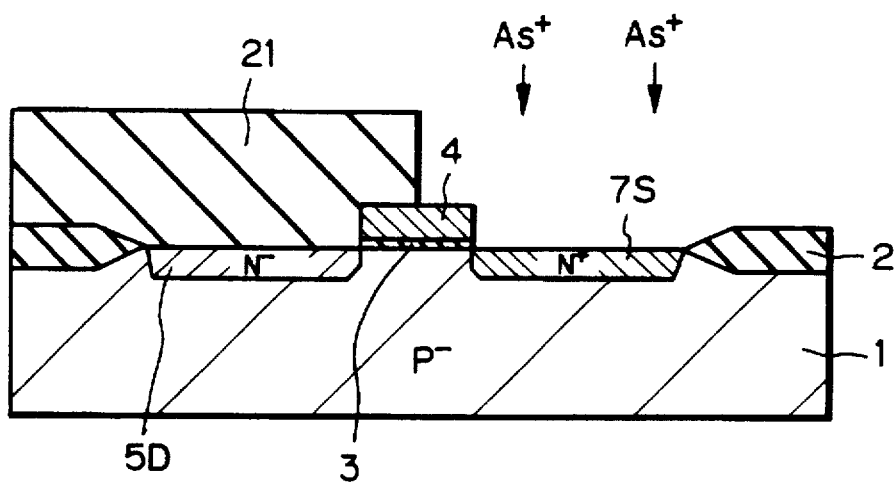

Next, referring to FIG. 5B, a photoresist pattern layer 21 is formed only on the drain region by using a photolithography process. Then, about 5×10¹⁵ arsenic ions/cm² are doped into the substrate 1, to form an N⁺-type inpurity diffusion region 7S.

Figure 5C:
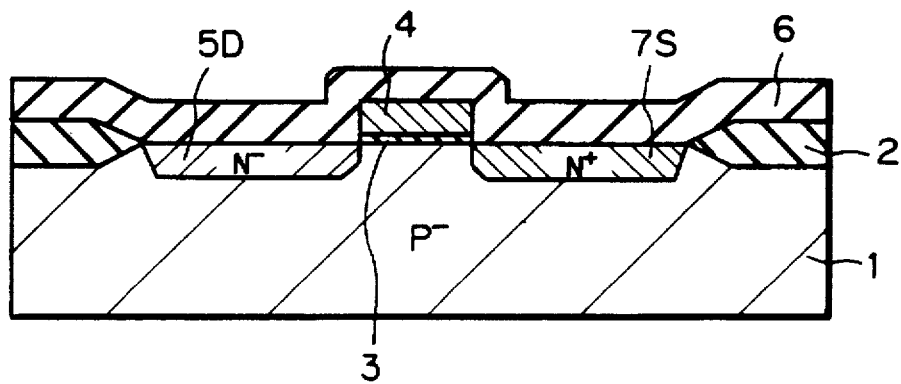

Next, referring to FIG. 5C, in the same way as in FIG. 1B, an about 2000 Å thick silicon oxide layer 6 is deposited on the entire surface by using a high temperature LPCVD process.

Figure 5D:
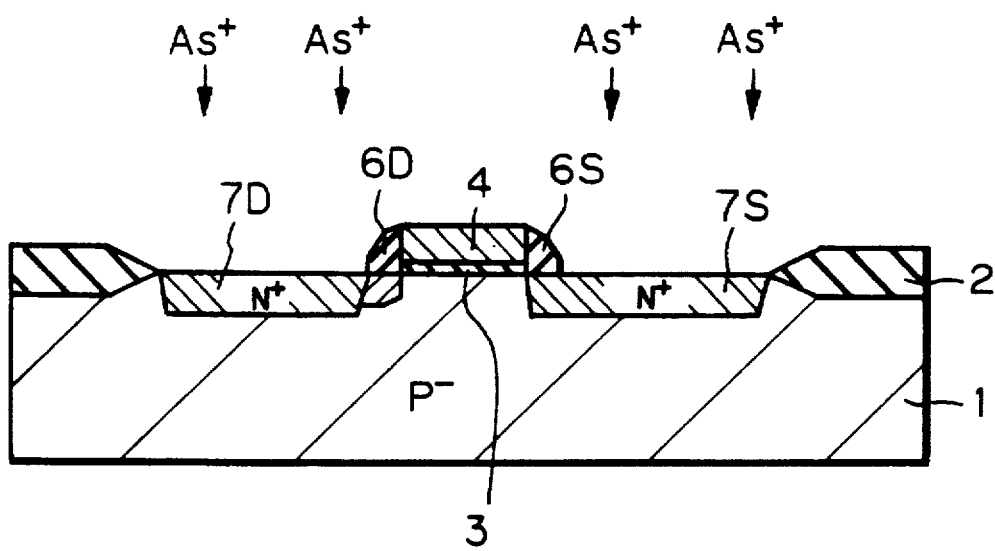

Next, referring to FIG. 5D, in the same way as in FIG. 1C, the silicon oxide layer 6 is etched back by using an anisotropicalal RIE etching process, so that sidewall silicon oxide layers 6D and 6C are left on the sides of the gate electrode 4. Then, about 1×10¹⁵ arsenic ions/cm² are implanted into the substrate 1 with a mask of the gate electrode 4 and the sidewall silicon oxide layers 6D and 6S, so that an N⁺-type impurity deffusion region 7D is formed within the substrate 1 in self-alignment with the sidewall silicon layer 6D. In this case, the N⁺-type impurity diffusion region 7D is located outside of the N⁻-type impurity diffusion region 5D.

Figure 5E:
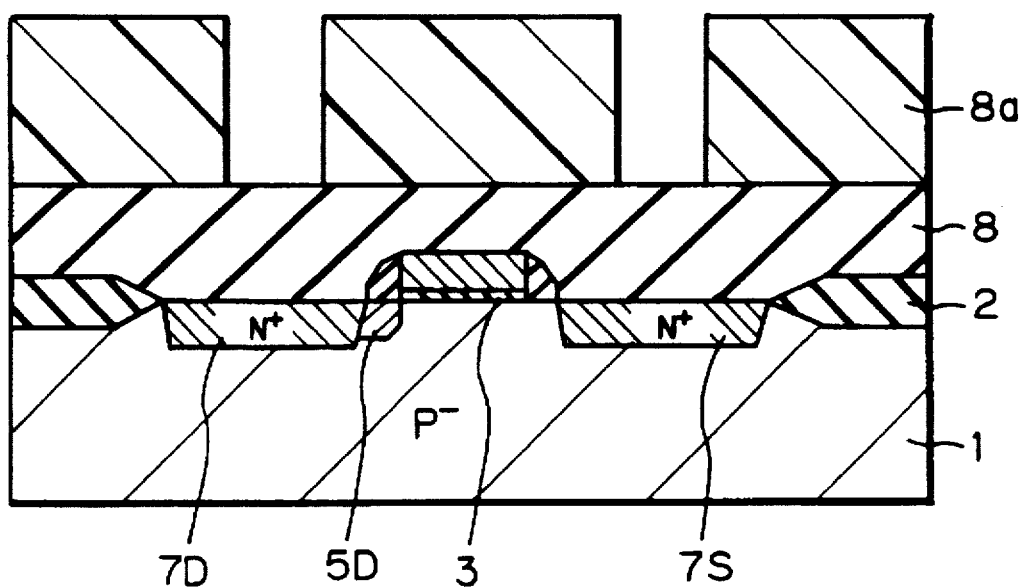

Next, referring to FIG. 5E, in the same way as in FIG. 1D, an about 5000 Å thick PSG layer 8 is deposited on the entire surface by using a CVD process. Then, a photoresist pattern layer 8a is formed by using a photolithography process.

Figure 5F:
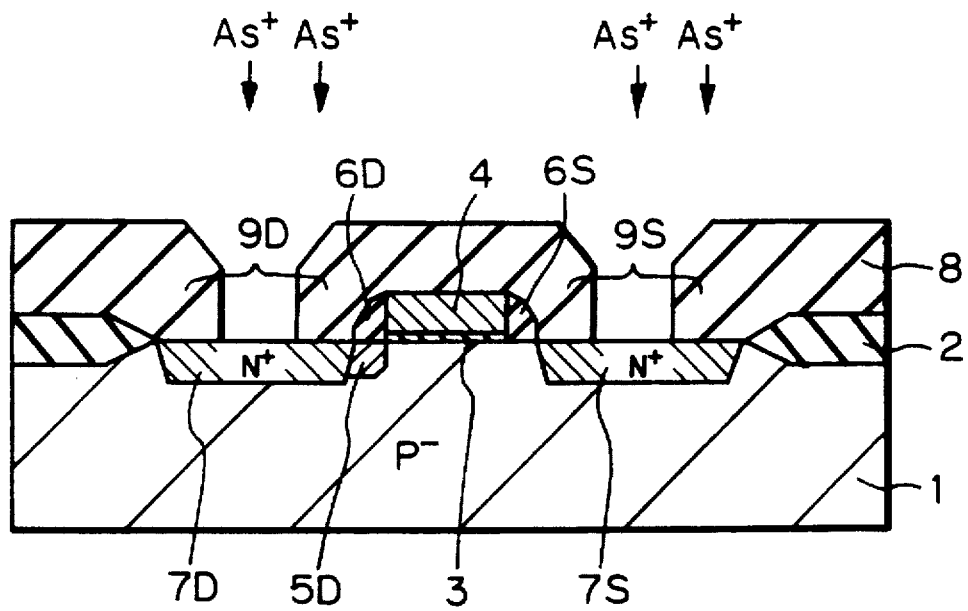

Next, referring to FIG. 5F, in the same way as in FIG. 1E, the PSG layer 8 is patterned by using an RIE process. As a result, contact holes 9D and 9S for the N⁺-type impurity regions 7D and 7S, respectively, are perforated within the PSG layer 8, and simultaneously, a contact hole (not shown) is perforated within the PSG layer 8. Also, about 5×10¹⁵ phosphorous ions or arsenic ions/cm² are implanted into the PSG layer 8 in the periphery of the contact holes, to avoid junction leakage current flowing through contact structures (see aluminium connection layer 10) formed in the contact holes.

Figure 5G:
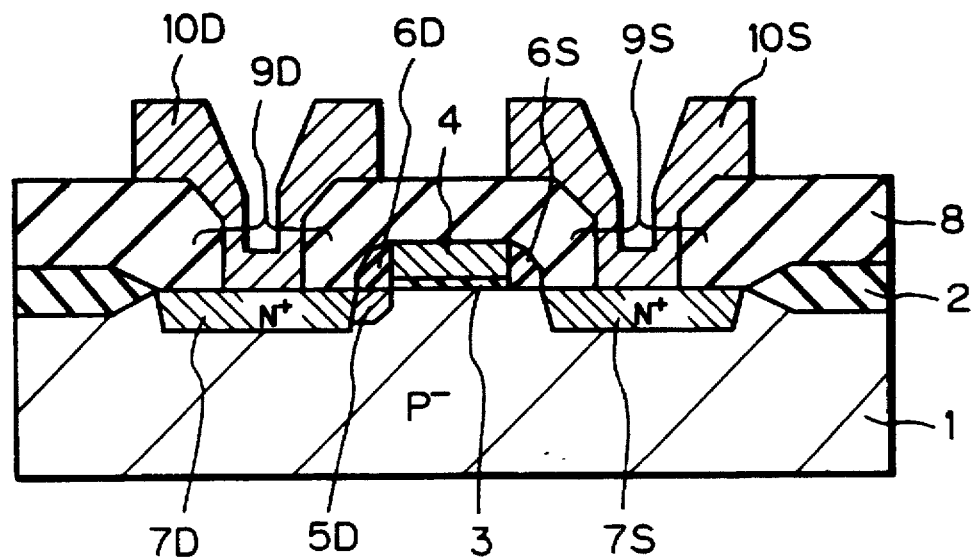

Finally, referring to FIG. 5G, in the same way as in FIG. 1F, an aluminum layer is deposited on the entire surface, and is patterned by using a photolithography process and an RIE process, to form connection layers 10D and 10S within the contact holes 9D and 9S, respectively, and a connection layer (not shown) connected to the gate electrode 4.

Thus, an asymmetrical LDD type MOS transistor is completed.

In the prior art asymmetrical LDD type MOS transistor as shown in FIGS. 5A through 5G, however, an additional photolithography process for forming the N⁺-type impurity diffusion region 7S as shown in FIG. 5B is required to increase the manufacturing cost. Also, high concentration arsenic ion implantation processes are increased which invite charging-up of charges (electrons) within the substrate 1 and destruction of the gate silicon oxide layer 3.

Another prior art method for manufacturing an asymmetrical LDD type MOS transistor is explained next with reference to FIGS. 6 and 7A and 7B.

Figure 6:
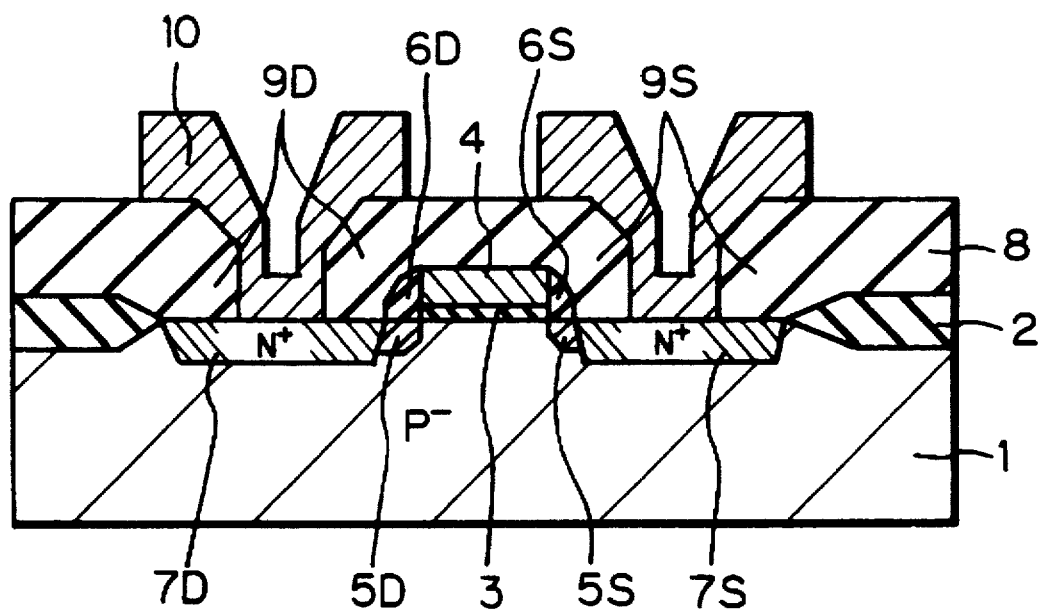
FIG. 6 is a cross-sectional view illustrating another prior art asymmetrical LDD type MOS device.
Figure 7A:
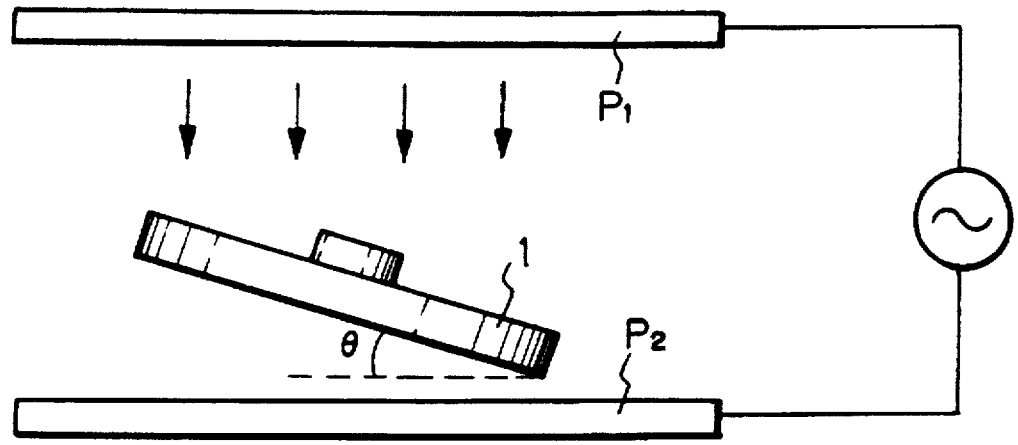
FIGS. 7A and 7B are cross-sectional views for explaining the method for manufacturing the device of FIG. 6.
Figure 7B:
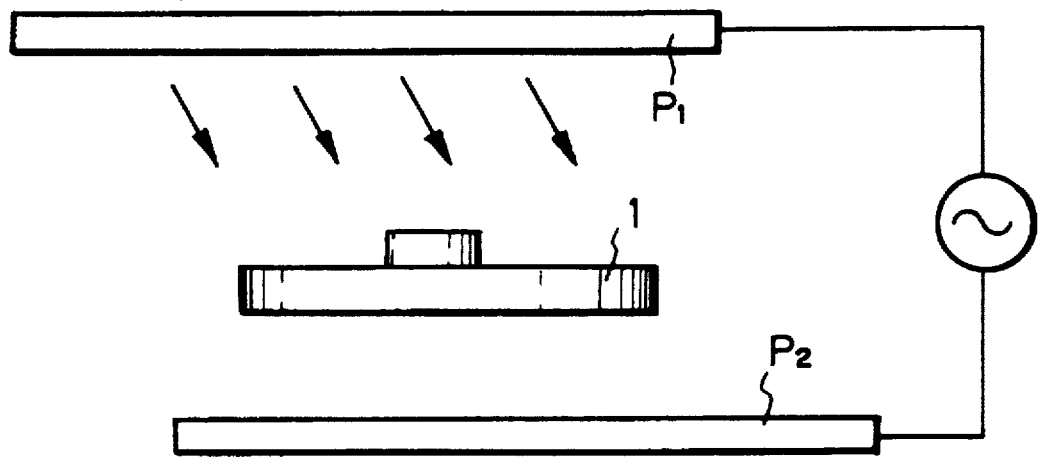

As shown in FIG. 6, which corresponds to FIG. 1F, the width of the sidewall silicon oxide layer 6S is smaller than that of the sidewall silicon oxide layer 6D, and accordingly, the width of the N⁻-type impurity diffusion region 5S is smaller than that of the N⁻-type impurity diffusion region 6S.

The imbalance between the sidewall silicon oxide layers 6D and 6S are formed by sloping the substrate as shown in FIG. 1B with respect to the angle of propagation plasma ions generated in an RIE process for etching back the silicon oxide layer 6. For example, as illustrated in FIG. 7A which schematically illustrates a plasma etching chamber, the substrate 1 is sloped by an angle of θ with respect to a propagation direction of plasma ions determined by two electrodes $P_1$ and $P_2$. Otherwise, as illustrated in FIG. 7B, the position of the electrode $P_1$ is shifted in relation to that of the electrode $P_2$.

In the prior art asymmetrical LDD type MOS transistor as shown in FIG. 6, although the manufacturing steps are not increased as compared with the symmetrical LDD type MOS transistor, it is difficult to accurately control the width of the N⁻-type impurity region 5S. Also, it is impossible to invalidate the N⁻-type impurity diffusion region 5S. Further, a plurality of MOS transistors formed on the same substrate are arranged along the same direction, i.e., the position of a drain of one MOS transistor is relatively definite with respect to that of a source thereof, and therefore, it is impossible to adopt a common source region for two MOS transistors, thus reducing the integration.

FIGS. 8A through 8D are cross-sectional views for explaining a first embodiment of the method for manufacturing an asymmetrical LDD type MOS transistor.

Figure 8A:
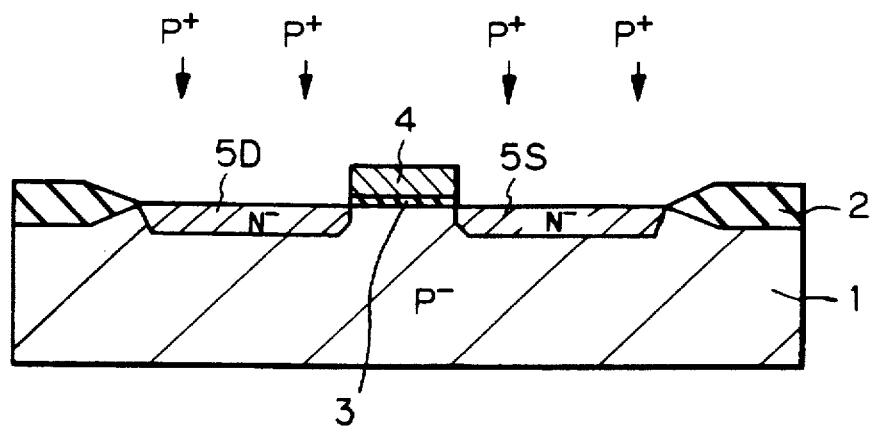
FIGS. 8A through 8G are cross-sectional views for explaining a first embodiment of the method for manufacturing an asymmetrical LDD type MOS device.

First, referring to FIG. 8A, in the same way as in FIG. 1A, an about 5000 Å thick field silicon oxide layer 2 is grown on a P⁻-type monocrystalline silicon substrate 1 by using a LOCOS process. Then, an about 150 Å thick gate silicon oxide layer 3 is grown by thermally oxidizing the substrate 1. Then, an about 2000 Å thick polycrystalline silicon layer is deposited on the entire surface by using an LPCVD process, and about 5×10⁵ N-type impurity ions such as phosphorous ions/cm² are implanted into the polycrystalline silicon layer. After that, the polycrystalline silicon layer is patterned by using a photolithography process and an RIE process 4. Then, about $1\times10^{13}$ phosphorous ions/cm$^2$ are implanted into the substrate 1, and the device is annealed in a nitrogen atmosphere at a temprature of about 900°. Thus, N$^-$-type impurity diffusion regions 5D and 5S are formed within the substrate 1 in self-alignment with the gate electrode 4.

Figure 8B:
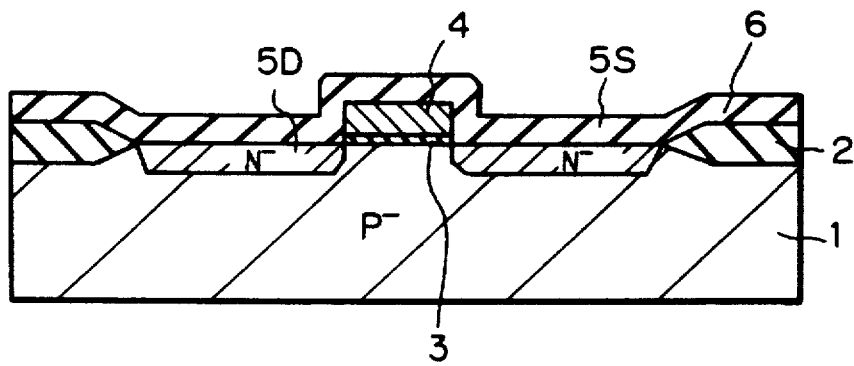

Next, referring to FIG. 8B, in the same way as in FIG. 1B, an about 2000 Å thick silicon oxide layer 6 is deposited on the entire surface by using a high temperature LPCVD process.

Figure 8C:
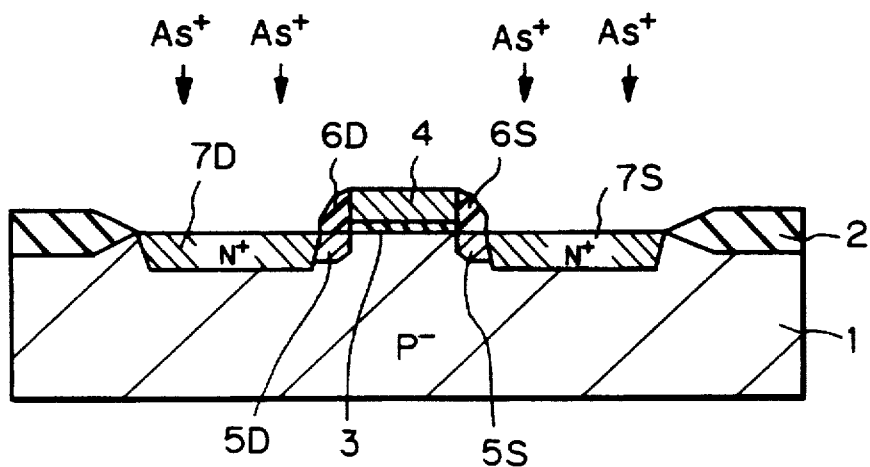

Next, referring to FIG. 8C, in the same way as in FIG. 1C, the silicon oxide layer 6 is etched back by using an anisotropicalal RIE etching process, so that sidewall silicon oxide layers 6D and 6C are left on the sides of the gate electode 4. Then, about $1\times10^{15}$ arsenic ions/cm$^2$ are implanted into the substrate 1 with a mask of the gate electrode 4 and the sidewall silicon oxide layers 6D and 6S, so that N$^+$-type impurity diffusion regions 7D and 7S are formed within the substrate 1 in self-alignment with the sidewall silicon layers 6D and 6S. In this case, the N$^+$-type impurity diffusion regions 7D and 7S are located outside of the N$^-$-type impurity diffusion regions 5D and 5S, respectively.

Figure 8D:
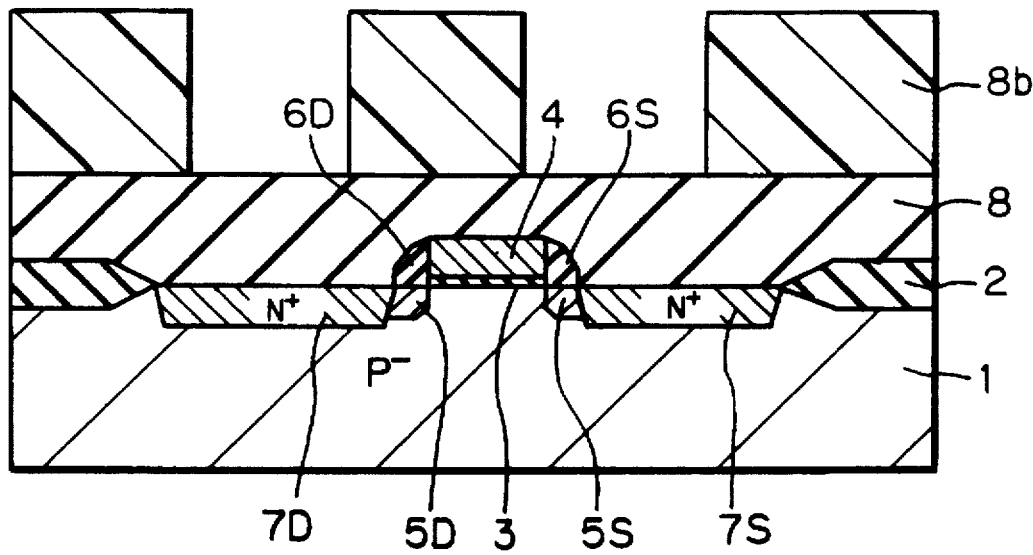

Next, referring to FIG. 8D, in the same way as in FIG. 1D, an about 5000 Å thick PSG layer 8 is deposited on the entire surface by using a CVD process. Then, a photoresist pattern layer 8b, which is a little different from the photoresist pattern layer 8b of FIG. 1D, is formed by using a photolithography process.

Figure 8E:
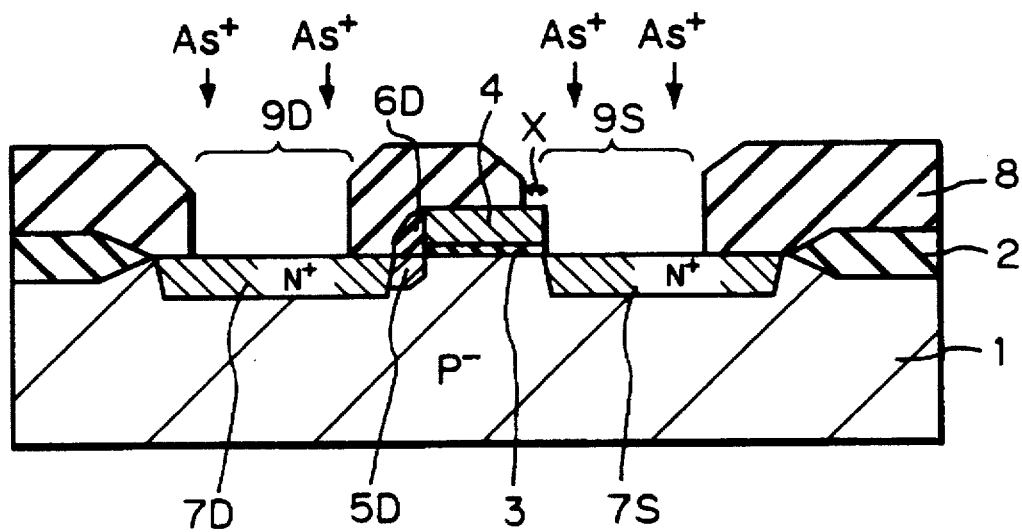

Next, referring to FIG. 8E, in the same way as in FIG. 1E, the PSG layer 8 is patterned by using an RIE process. As a result, contact holes 9D and 9S for the N$^+$-type impurity regions 7D and 7S, respectively, are perforated within the PSG layer 8, and simultaneously, a contact hole (not shown) is perforated within the PSG layer 8. In this case, note that the sidewall silicon oxide layer 6S is also removed. Then, about $5\times10^{15}$ phosphorous ions or arsenic ions/cm$^2$ are implanted into the entire surface. As a result, the N$^+$-type impurity region 7S is enlarged, so that the N$^+$-type inpurity region 7S is in alignment with the gate electrode 4. Also, since the impurities are doped into the PSG layer 8 in the periphery of the contact holes, junction leakage current flowing through contact structures (see aluminium connection layer 10) formed in the contact holes can be avoided.

Figure 8F:
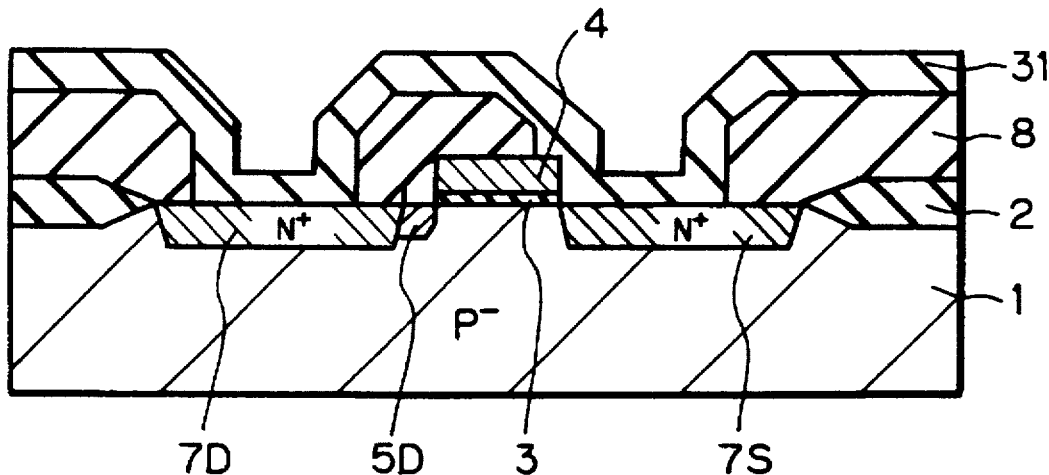

Next, referring to FIG. 8F, an about 2000 Å thick silicon oxide layer 31 is formed by a high temperature LPCVD process.

Figure 8G:
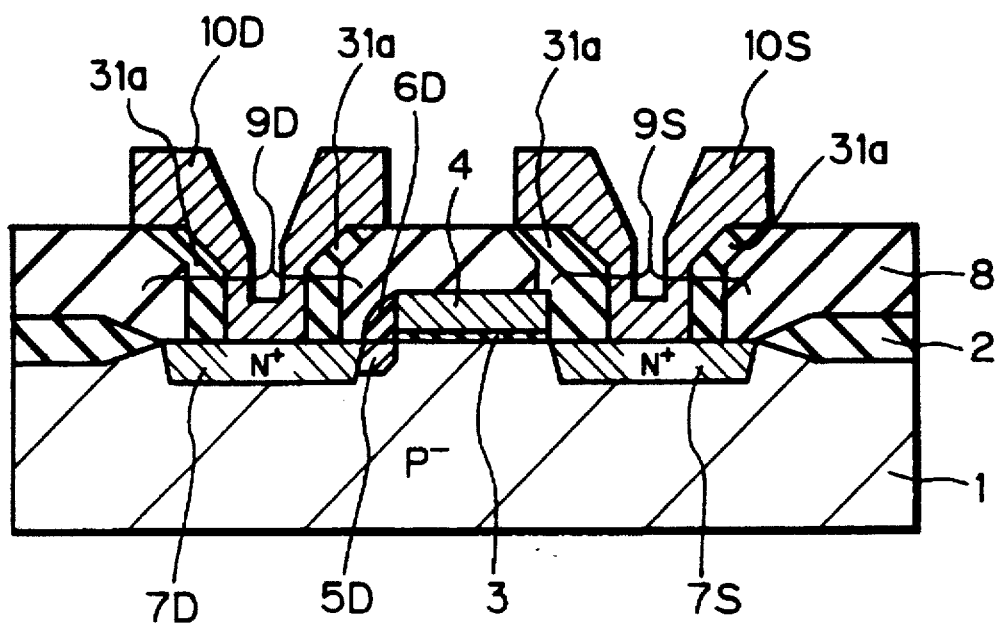

Finally, referring to FIG. 8G, the silicon oxide layer 31 is etched back by using an anisotropical RIE process, so that about 2000 Å thick insulating spacers 31a are left within the contact holes 9D and 9S. At this time, if an overlap X (see FIG. 8E) between the gate electode 4 and the contact hole 9S, i.e., the width X of an exposed portion of the gate electrode 4 when the contact hole 9S is formed is smaller than that of the insulating spacers 31a, the gate electrode 4 is never exposed after the etching back process. After that, an aluminum layer is deposited on the entire surface, and is patterned by using a photolithography process and an RIE process, to form connection layers 10D and 10S within the contact holes 9D and 9S, respectively, and a connection layer 10G (shown not in FIG. 8G, but FIG. 9) connected to the gate electrode 4.

Thus, an asymmetrical LDD type MOS transistor is completed.

Figure 9:
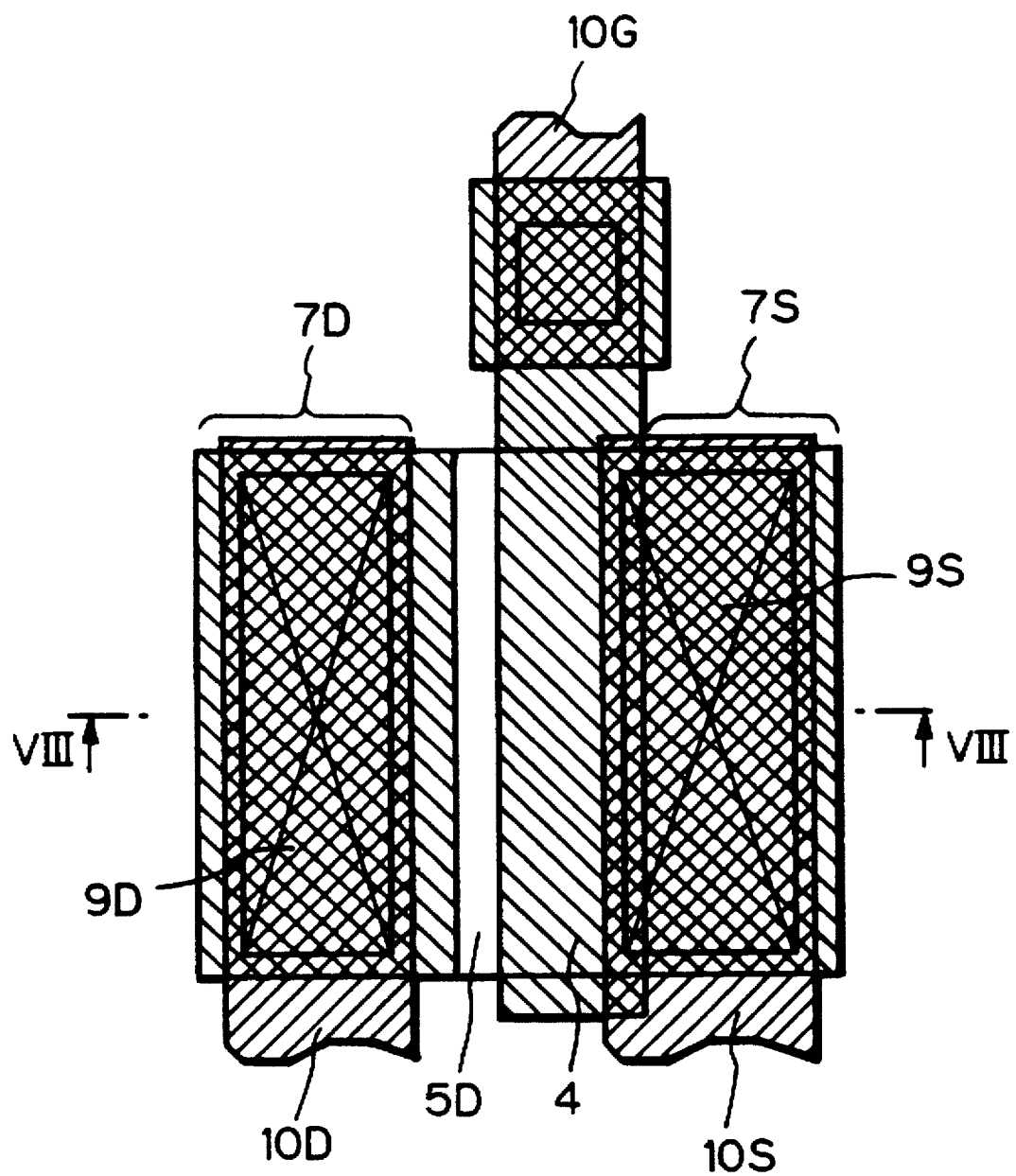
FIG. 9 is a plan view of the device of FIG. 8G.

Note that FIG. 9 is plan view of the device of FIG. 8G, and FIG. 8G is a cross-sectional view taken along the line VIII—VIII of FIG. 9.

According to the first embodiment, the N$^+$-type impurity region 7S can be formed without adding a photolithography process and an etching process as shown in FIG. 5B. That is, only a step for forming the silicon oxide layer 31 as shown in FIG. 8F and a step for etching back the silicon oxide layer 31 (31a) as shown in FIG. 8G are added to the manufacturing steps for the symmetrical LDD type MOS transistor as shown in FIGS. 1A through 1F. Thus, the manufacturing steps according to the first embodiment is excellent as compared with those of the asymmetrical LDD type MOS transistor as shown in FIGS. 5A through 5G.

Figure 10:
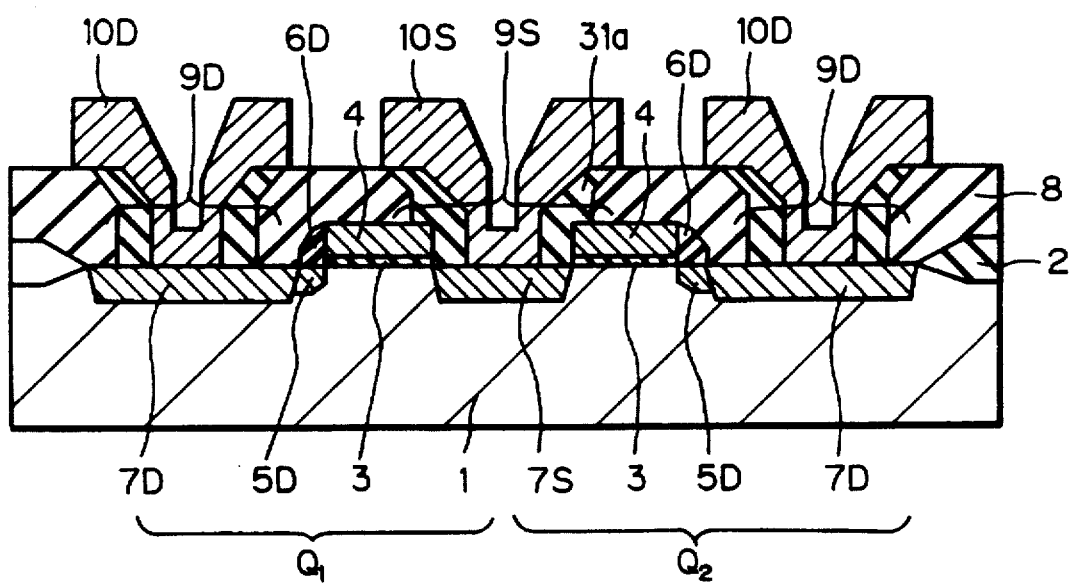
FIG. 10 is cross-sectional view for explaining a second embodiment of the method for manufacturing an asymmetrical LDD type MOS device.
Figure 11:
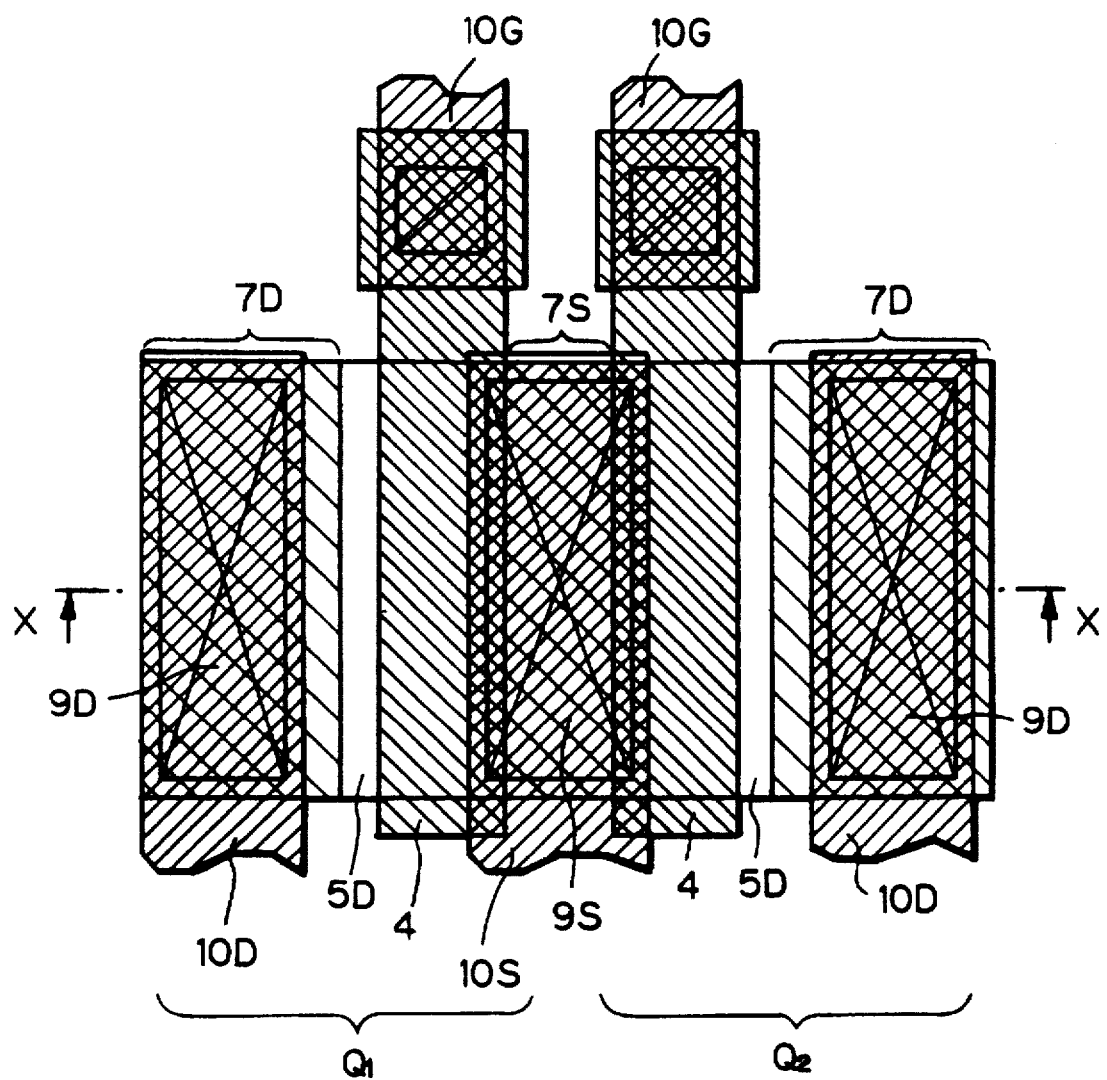
FIG. 11 is a plan view of the device of FIG. 10.

FIGS. 10 and 11 are a cross-sectional view and a plan view, respectively, for explaining a second embodiment of the method for manufacturing an asymmetrical LDD type MOS transistor according to the present invention. Note that FIG. 10 is a cross-sectional view taken along the line X—X of FIG. 11. Also, FIGS. 10 and 11 correspond to FIGS. 8G and 9, respectively.

In FIGS. 10 and 11, two MOS transistors $Q_1$ and $Q_2$ are connected by their common source which is, in this case, formed by the N$^+$-type impurity diffusion region 7S. The transistors $Q_1$ and $Q_2$ are manufactured by the same steps of the first embodiment as shown in FIGS. 8A through 8G, except that the contact hole 9S overlaps a part of the two gate electrodes 4.

According to the second embodiment, since the N$^-$-type impurity diffusion regions are not present on the side of the N$^+$-type impurity diffusion region 7S, the ON current can be increased and also, the integration can be enhanced. Note that, it is impossible to construct two common source MOS transistors by using the manufacturing method as shown in FIGS. 6 and 7A (or 7B), since the drains to the sources of MOS transistors are along one direction.

Figure 12:
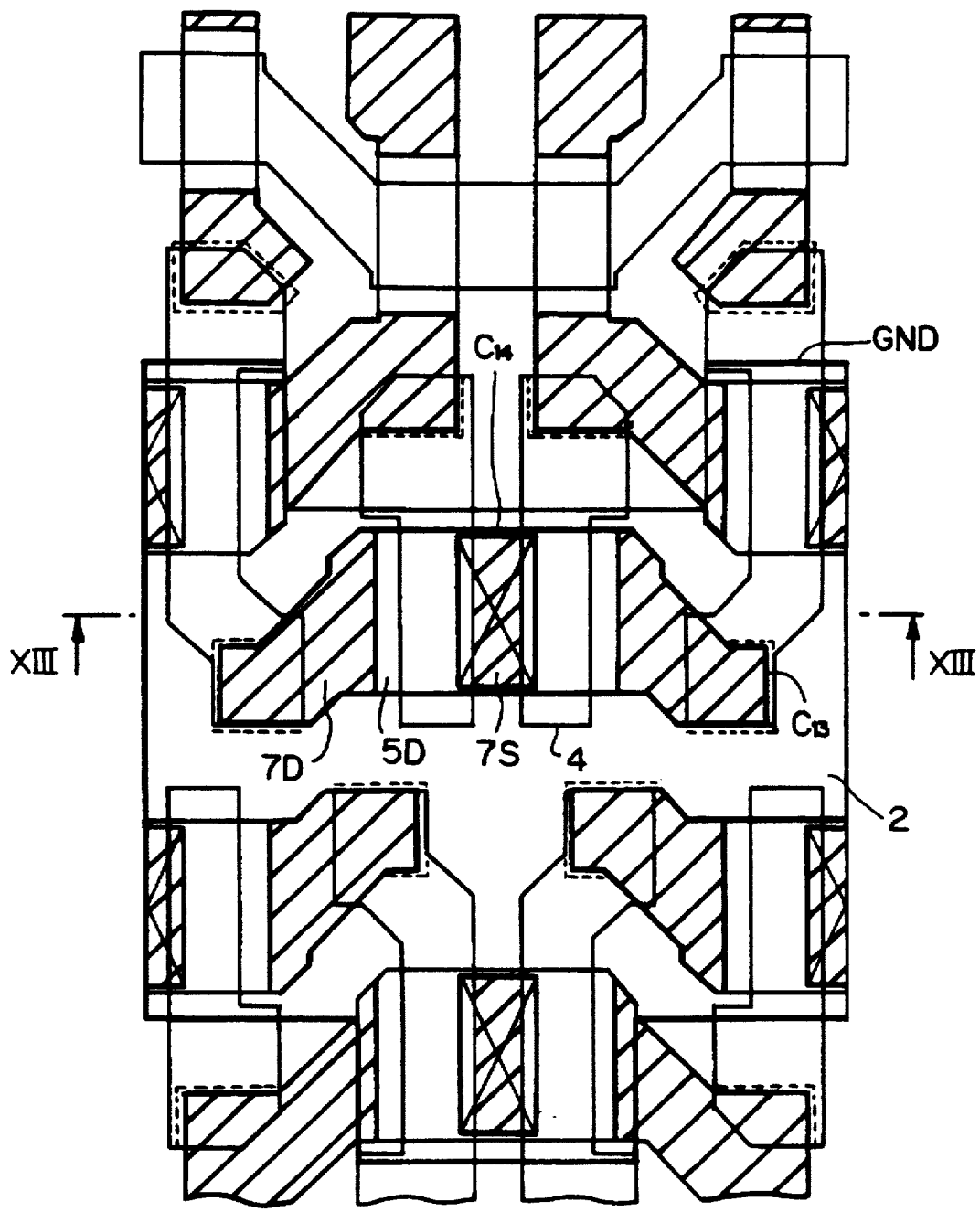
FIGS. 12 and 14 are plan views of SRAM cells to which the manufacturing method as shown in FIGS. 10 and 11 is applied.
Figure 13:
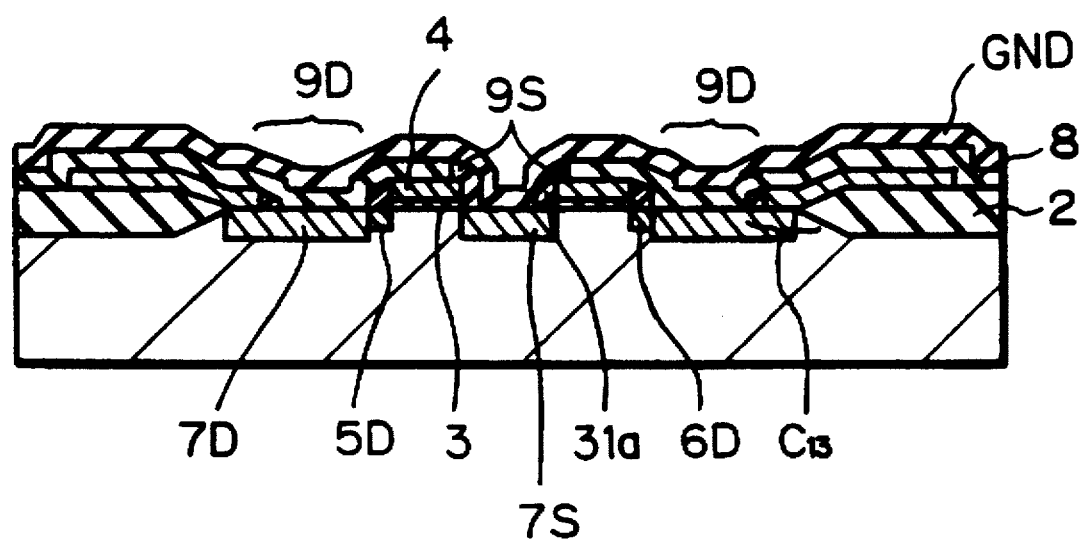
FIGS. 13 and 15 are cross-sectional views of the devices of FIGS. 12 and 14, respectively.
Figure 14:
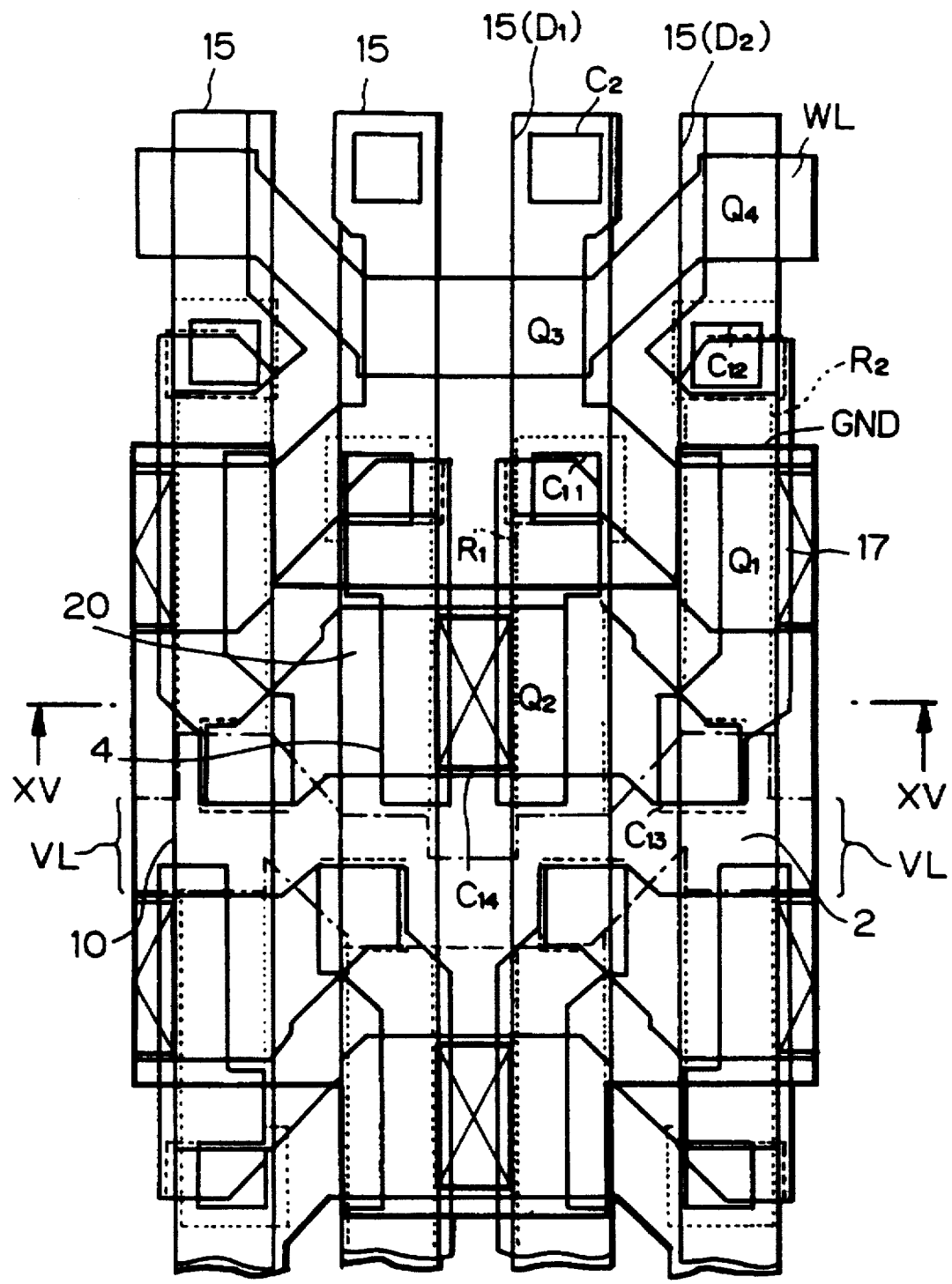
Figure 15:
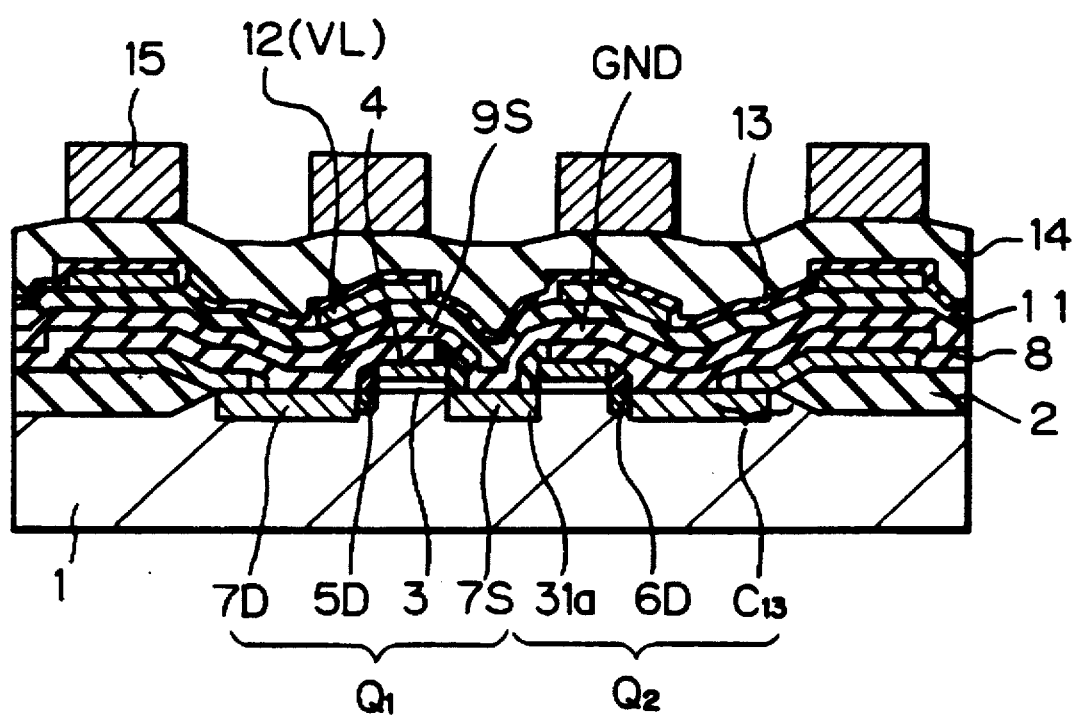

The second embodiment as shown in FIGS. 10 and 11 is applied to an SRAM cell as illustrated in FIGS. 12 through 15. Note that, FIG. 13 is a cross-sectional view taken along the line XIII—XIII of FIG. 12, and FIG. 15 is a cross-sectional view taken along the line XV—XV of FIG. 14.

First, referring to FIGS. 12 and 13, an about 5000 Å thick field silicon oxide layer 2 is grown on a P$^-$-type monocrystalline silicon substrate 1 by using a LOCOS process. Then, an about 150 Å thick gate silicon oxide layer 3 is grown by thermally oxidizing the substrate 1. Then, a direct contact hole $C_{13}$ is formed within the gate silicon oxide layer 3 by using a photolithography process and a wet etching process with fluorohydrogen. Then, in the same way as in the first embodiment, gate electrodes 4, N$^-$-type impurity diffusions regions 5D (also, 5S, not shown), sidewall silicon oxide layers 6D (also, 6S, not shown), and N$^+$-type impurity diffusion regions 7D and 7S are sequentially formed. Then, a PSG layer 8 is formed, and is patterned to form a contact hole $C_{14}$ for a common source. Then, about $5\times10^{15}$ arsenic ions/cm$^2$ are implanted into the entire surface. As a result, the common source region 7S is formed in alignment with the two gate electrodes 4. Then, an insulating spacer 31a is formed on the side of the PSG layer 8. Then, an about 1500 Å thick high temperature melting metal silicide layer is deposited and is patterned by using a photolithography process and an RIE process, to form a ground connection layer GND.

Next, referring to FIGS. 14 and 15, an interlayer 11 is formed, and contact holes $C_{11}$ and $C_{12}$ for the high resistance loads $R_1$ and $R_2$ are perforated in the interlayer 11. As a result, the high resistance loads $R_1$ and $R_2$ can be connected to the gates of the driving transistors $Q_2$ and $Q_1$, respectively. Next, an about 1500 Å thick polycrystalline silicon layer is deposited by using a LPCVD process, and is patterned by using a photolithography process and an RIE process, to form a high resistance polycrystalline silicon layer 12 serving as the high resistance loads $R_1$ and $R_2$. After that, about $1\times10^{15}$ arsenic ions/cm$^2$ are implanted into only a power supply connection area of the polycrystalline silicon layer 12 by a photolithography process and an ion-implantation process, to form the high voltage line VL. Next, about 1000 Å thick silicon oxide layer is formed by a CVD process to form a high resistance cover layer 13, and about 5000 Å thick PSG layer is formed by a CVD process to form an interlayer 14. Then, a digital contact hole $C_2$ is formed within the interlayer 14 and the high resistance cover layer 13. Then, an aluminum layer 15 is deposited and is patterned to form the digit lines $D_1$ and $D_2$. Thus, one SRAM cell is completed.

The SRAM cell using the asymmetrical LDD type MOS transistors according to the present invention has various advantages as compared with the SRAM cell using the prior art symmetrical LDD type MOS transistors. Generally, cell stabilization regarding a $V_{CC}$ (VL) voltage margin, a noise margin or a soft error duration in the SRAM cell is discussed by using a cell ratio of an ON current flowing through the driving transistor to an ON current flowing through the transfer transistor. That is, if the cell ratio is large, the SRAM cell is stable, while if the cell ratio is small, the SRAM cell is unstable. Therefore, in order to stabilize the SRAM cell, it is preferable that a value W/L of the driving transistor (W: gate width, L: gate length) be large. In this case, when the gate length L is small a so-called short channel effect may be invited. Therefore, usually, the gate width is made large; however, the integration is reduced, so a trade-off between the cell stabilization and the integration (cell size) occurs.

In the SRAM cell according to the present invention, since the driving transistors $Q_1$ and $Q_2$ use the asymmetrical LDD type MOS transistors having a common source, the ON current flowing therethrough is increased by about 20 percent as compared with the SRAM cell using the prior art symmetrical LDD type MOS transistors, i.e., the cell ratio is increased. As a result, the cell stabilization regarding the $V_{CC}$ margin, the noise margin and the soft error duration is enhanced. In other words, if the same cell ratio in maintained, the gate width W can be reduced by about 20 percent, to reduce the cell size. Further, the absence of N$^-$-type impurity diffusions in the driving transistors contributes to the reduction of the cell size by about 15 percent.

Note that the above-described gate electrode 4 is made of polycrystalline silicon; however, this gate electrode can be made of double polycide films including a polycrystalline silicon film and a high melting temperature metal silicide layer thereon.

As explained hereinbefore, according to the present invention, a high performance asymmetrical LDD type MOS transistor can be manufactured without increasing the manufacturing steps. Also, a high performance and high integration SRAM cell can be obtained.

I claim:

1. A method for manufacturing an asymmetrical LDD type semiconductor device, comprising the steps of:

forming a gate insulating layer on a semiconductor substrate of a first conductivity type;

forming a gate electrode on said gate insulating layer;

introducing impurities of a second conductivity type opposite to the first conductivity type into said semiconductor substrate with a mask of said gate electrode, to form first impurity diffusion regions within said semiconductor substrate;

forming sidewall insulating layers on both sides of said gate electrode;

introducing impurities of the second conductivity type into said semiconductor substrate with a mask of said sidewall insulating layers and said gate electrode, to form second impurity diffusion regions within said semiconductor substrate;

forming an insulating layer on the entire surface including said second impurity diffusion regions;

forming contact holes in said insulating layer, one of said contact hole leading to one of said second impurity diffusion regions, another of said contact holes leading to another of said second impurity diffusion region and a part of said gate electrode; and introducing impurities of the second conductivity type into said semiconductor substrate with a mask of said insulating layer having said contact holes formed therein.

2. A method as set forth in claim 1, further comprising the steps of:

forming insulating spacers on sides of said contact holes; and forming metal connection layers within said insulating spacers and leading to said second impurity diffusion regions.

3. A method as set forth in claim 1, wherein the concentration of impurities of said first impurity diffusion regions is smaller than that of said second impurity diffusion regions.

4. A method for manufacturing an asymmetrical LDD type semiconductor device, comprising the steps of:

forming a gate insulating layer on a semiconductor substrate of a first conductivity type;

forming a gate electrode on said gate insulating layer;

introducing impurities of a second conductivity type opposite to the first conductivity type into said semiconductor substrate with a mask of said gate electrode, to form first and second impurity diffusion regions within said semiconductor substrate on both sides of said gate electrode;

forming first and second sidewall insulating layers on both sides of said gate electrode;

introducing impurities of the second conductivity type into said semiconductor substrate with a mask of said first and second sidewall insulating layers and said gate electrode, to form third and fourth impurity diffusion regions within said semiconductor substrate outside of said first and second sidewall insulating layers;

forming an insulating layer on the entire surface including said third and fourth impurity diffusion regions;

forming first and second contact holes in said insulating layer, said first contact hole leading to said third impurity diffusion region, said second contact hole leading to said fourth impurity diffusion region and a part of said gate electrode; and introducing impurities of the second conductivity type into said semiconductor substrate with a mask of said insulating layer having said first and second contact holes formed therein.

5. A method as set forth in claim 4, further comprising the steps of:

forming first and second insulating spacers on sides of said first and second contact holes, respectively, and forming first and second metal connection layers within said first and second insulating spacers and leading to said third and fourth impurity diffusion regions, respectively.

6. A method as set forth in claim 4, wherein the concentration of impurities of said first and second impurity diffusion regions is smaller than that of said third and fourth impurity diffusion regions.

7. A method for manufacturing an asymmetrical LDD type semiconductor device, comprising the steps of:

forming a gate insulating layer on a semiconductor substrate of a first conductivity type;

forming first and second gate electrodes on said gate insulating layer;

introducing impurities of a second conductivity type opposite to the first conductivity type into said semiconductor substrate with a mask of said first and second gate electrodes, to form first, second and third impurity diffusion regions within said semiconductor substrate, said first impurity diffusion region being located outside of said first gate electrode with respect to said second gate electrode, said second impurity diffusion region being located between said first and second gate electrodes, said third impurity diffusion region located outside of said second gate electrode with respect to said first gate electrode;

forming sidewall insulating layers on both sides of said first and second gate electrodes;

introducing impurities of the second conductivity type into said semiconductor substrate with a mask of said sidewall insulating layers and said first and second gate electrodes, to form fourth, fifth and sixth impurity diffusion regions within said semiconductor substrate, said fourth impurity diffusion region being located outside of said first gate electrode with respect to said second gate electrode, said fifth impurity diffusion region being located between said first and second gate electrodes, said sixth impurity diffusion region located outside of said second gate electrode with respect to said first gate electrode;

forming an insulating layer on the entire surface including said fourth, fifth and sixth impurity diffusion regions;

forming first, second and third contact holes in said insulating layer, said first contact hole leading to said fourth impurity diffusion region, said second contact hole leading to said fifth impurity diffusion region, a part of said first gate electrode said third contact hole leading to said sixth impurity region; and and a part of said second gate electrode, introducing impurities of the second conductivity type into said semiconductor substrate with a mask of said insulating layer having said first, second and third contact holes formed therein.

8. A method as set forth in claim 7, further comprising the steps of:

forming first, second and third insulating spacers on sides of said first, second and third contact holes, respectively, and forming first, second and third metal connection layers within said first, second and third insulating spacers and leading to said fourth, fifth and sixth impurity diffusion regions, respectively.

9. A method as set forth in claim 7, wherein the concentration of impurities of said first, second and third impurity diffusion regions is smaller than that of said fourth, fifth and sixth impurity diffusion regions.

\* \* \* \* \*